(12) United States Patent
Langner et al.

(10) Patent No.: US 8,930,799 B1
(45) Date of Patent: Jan. 6, 2015

(54) METHODS AND APPARATUS FOR CORRECTING BLOCK-CODED DATA ERRORS WITH AN ERROR DETECTION CODE

(75) Inventors: Paul Langner, Fremont, CA (US); Ramin Shirani, Morgan Hill, CA (US)

(73) Assignee: Aquantia Corp., Milpitas, CA (US)

( * ) Notice: Subject to any disclaimer, the term of this patent is extended or adjusted under 35 U.S.C. 154(b) by 401 days.

(21) Appl. No.: 13/039,099

(22) Filed: Mar. 2, 2011

Related U.S. Application Data

(60) Provisional application No. 61/310,096, filed on Mar. 3, 2010.

(51) Int. Cl.
*H03M 13/00* (2006.01)

(52) U.S. Cl.
USPC ............. 714/785; 714/758; 714/774

(58) Field of Classification Search
CPC .. H03M 13/159; H03M 13/09; G06F 11/1004
USPC ................................ 714/776, 758, 785
See application file for complete search history.

(56) References Cited

U.S. PATENT DOCUMENTS

| | | | | |
|---|---|---|---|---|
| 6,327,691 | B1 * | 12/2001 | Huang | 714/781 |
| 6,985,536 | B2 * | 1/2006 | Oelcer et al. | 375/261 |
| 2009/0103649 | A1 * | 4/2009 | Vare et al. | 375/295 |
| 2010/0153805 | A1 * | 6/2010 | Schmidt et al. | 714/748 |

* cited by examiner

*Primary Examiner* — M. Mujtaba K. Chaudry
(74) *Attorney, Agent, or Firm* — Lance Kreisman; Peninsula Patent Group

(57) ABSTRACT

A method is disclosed for correcting bit errors in a block-coded data frame. The method includes receiving a plurality of block-coded symbols, each symbol including at least one unencoded bit; detecting a bit error in one of the plurality of symbols associated with the unencoded bits, the detecting carried out in accordance with an error detection algorithm; identifying the symbol having the bit error from among the plurality of symbols based on the error detection algorithm; and correcting the bit error in the identified symbol.

10 Claims, 6 Drawing Sheets

METHODS AND APPARATUS FOR CORRECTING BLOCK-CODED DATA ERRORS WITH AN ERROR DETECTION CODE

REFERENCE TO RELATED APPLICATIONS

This application claims the benefit of priority of U.S. Provisional Patent Application Ser. No. 61/310,096, filed Mar. 3, 2010, entitled "CRC-8 Frame Correction", which is fully incorporated by reference herein for all purposes.

TECHNICAL FIELD

The disclosure herein relates to electronic communications, and more particularly to decoding received data in electronic communications.

BACKGROUND

A variety of different standards and technologies may be employed to communicate information between computers and other electronic devices. Channel coding and error correction techniques can be used to reduce errors in received signals introduced from distortion and other disturbances. Such coding and error correction can be implemented using an encoder and a decoder at the ends of the transmission channel.

One increasingly popular communication standard is 10 Gigabit Ethernet, with a nominal data rate of 10 Gbit/s. One standard of 10 Gigabit Ethernet is IEEE 1OGBASE-T, used to provide 10 gigabit per second connections over unshielded or shielded twisted pair copper wires. The wire-level modulation for 1OGBASE-T is a Tomlinson-Harashima Precoded (THP) version of pulse-amplitude modulation with 16 discrete levels (PAM-16), encoded in a two-dimensional constellation pattern known as 128-DSQ (Double Square QAM).

As shown in FIG. 1, the 1OGBASE-T transmission frame is based on a (2048, 1723) Low Density Parity Check (LDPC) code, i.e. 2048 total bits with 1723 data bits and 325 check bits per frame, where the check bits are used to fix or detect errors in the frame. This is used in combination with the 128-DSQ synthetic constellation that uses a combination of coded and uncoded bits to transmit information. As shown, Ethernet data is retrieved in fifty 65-bit blocks and is scrambled, e.g. provided to a self-synchronizing scrambler to scramble the bits. To provide a modest degree of error detection capability for the uncoded information, a set of eight CRC-8 check bits are provided on one end of the frame and an auxiliary channel bit provided on the other end, creating 3259 bits in the frame payload. The payload is then divided up into 1723 bits for the LDPC coder, and 1536 uncoded bits (3×512) that are not coded by the LDPC coder. The coded LDPC check bits (325 bits) are added to the end of the payload. The LDPC block size after coding is 2048 total bits (4×512).

The resulting frame is mapped to 128-DSQ symbols, and the resulting DSQ symbols are then precoded using THP. Each of these 512 128-DSQ symbols are then transmitted as a pair of PAM-16 symbols (x-axis and y-axis), to create 1024 symbols (3584 bits). The constellation for the 128-DSQ symbols is shown in FIG. 2, and consists of 8 cosets (regions), each coset containing 16 points. The coset label contains the 3 uncoded bits as shown in FIG. 2, and the points within the coset contain the 4 coded bits protected using the LDPC block code. The labeling of the points in the coset (the coset elements) conveying the 4 coded bits is shown in FIG. 3.

A receiver unscrambles a received frame and decodes the coded bits. Any of several decoding algorithms for LDPC codes can be used in the receiver to decode the received coded bits. For example, iterative decoders are often used to converge on a correct decoded value. In one implementation, LDPC decoding is performed in the receiver using a soft-decision, message-passing algorithm. The bits are treated as continuous variables which represent the probability of the value being a 0 or a 1, and the continuous variables are represented in the decoding algorithm as Log Likelihood Ratios (LLRs). The message passing algorithm sets the variable nodes to the soft receive LLRs, calculates the syndrome LLRs given the variable LLRs, updates the variable LLRs with the new syndrome information, and iterates in this same way until a convergence is reached (e.g., check bits are all zero). Using the 1OGBASE-T transmission scheme, it is possible to have very low bit error rates that come very close to the Shannon limit of the communication channel.

While the proposed 1OGBASE-T transmission scheme works well for its intended applications, bit errors may occur in situations involving, for example, noise spikes that can impact a given symbol. The coded bits may generally remain valid, but the uncoded bits are susceptible to the spikes and may result in the coded bits being assigned to an incorrect coset. Further, since the uncoded bits are protected by a CRC-8 error detection algorithm, detection of an error results in discarding the entire frame. This may undesirably impact link performance, especially for TCP-based traffic.

Accordingly, systems and methods are needed that provide the capability to correct errors in block-coded data frames, such as high-speed ethernet systems, with error detection codes.

BRIEF DESCRIPTION OF THE DRAWINGS

Embodiments of the disclosure are illustrated by way of example, and not by way of limitation, in the figures of the accompanying drawings and in which like reference numerals refer to similar elements and in which.

DETAILED DESCRIPTION

Embodiments of an error correction method and circuit are disclosed for correcting bit errors in a block-coded data frame. One embodiment of the method includes receiving a plurality of block-coded symbols, each symbol including at least one unencoded bit; detecting a bit error in one of the plurality of symbols associated with the unencoded bits, the detecting carried out in accordance with an error detection algorithm; identifying the symbol having the bit error from among the plurality of symbols based on the error detection algorithm; and correcting the bit error in the identified symbol. In this manner, a straightforward error detection code, such as a CRC-8 code for example, may provide a way to correct bit errors, instead of having the invalid symbol retransmitted.

In a further embodiment, an error correction circuit is disclosed. The error correction circuit includes a slicer to receive a plurality of symbols and determine an appropriate constellation coset for each symbol. Each symbol includes at least one unencoded bit. An error detection circuit detects a bit error associated with the at least one unencoded bit in one of the plurality of symbols, and generates an error syndrome having a nonzero value if a bit error is detected. A memory stores a plurality of nonzero syndrome values and the corresponding possible error candidate symbols for each nonzero syndrome value. Selector circuitry couples to the memory to identify the candidate symbol having the detected bit error.

In yet another embodiment, a receiver is disclosed. The receiver circuit includes decoder circuitry to receive encoded sets of bits associated with respective symbols, each symbol including a set of uncoded bits. A slicer receives the symbols and determines a constellation coset for each symbol. Each symbol also includes at least one unencoded bit. An error detection circuit detects a bit error associated with the at least one unencoded bit in one of the plurality of symbols, and generates an error syndrome having a nonzero value if a bit error is detected. A memory stores a plurality of nonzero syndrome values and the corresponding possible error candidate symbols for each nonzero syndrome value. Selector circuitry couples to the memory to identify the candidate symbol having the detected bit error.]

Figure 1:
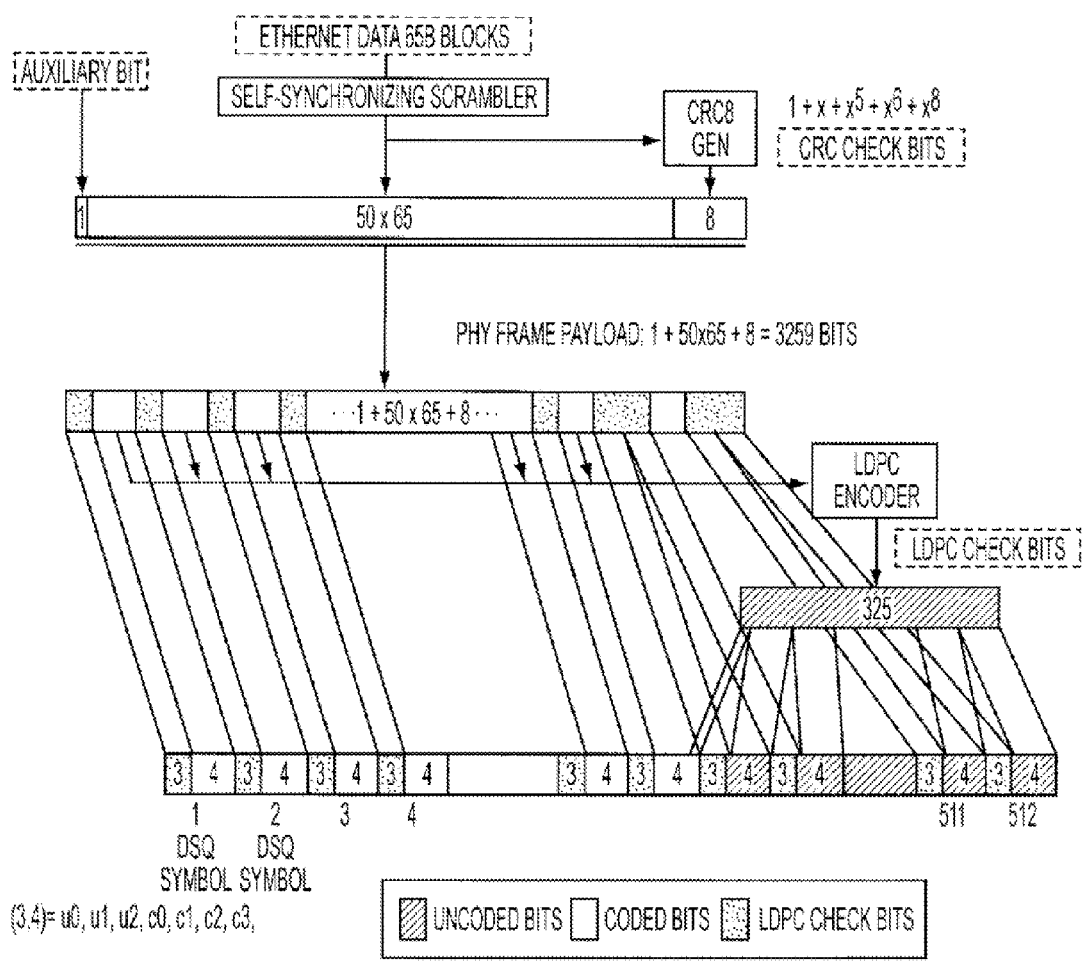
FIG. 1 illustrates a transmission frame for the 1OGBASE-T communication standard.
Figure 2:
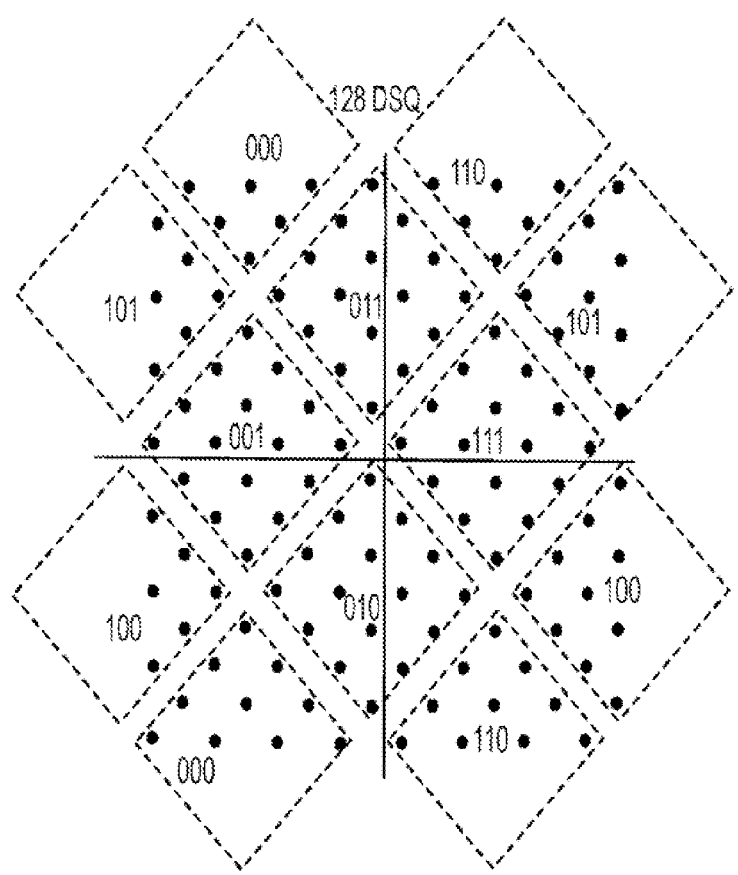
FIG. 2 illustrates a constellation for 128-DSQ modulation used in the standard of FIG. 1.
Figure 3:
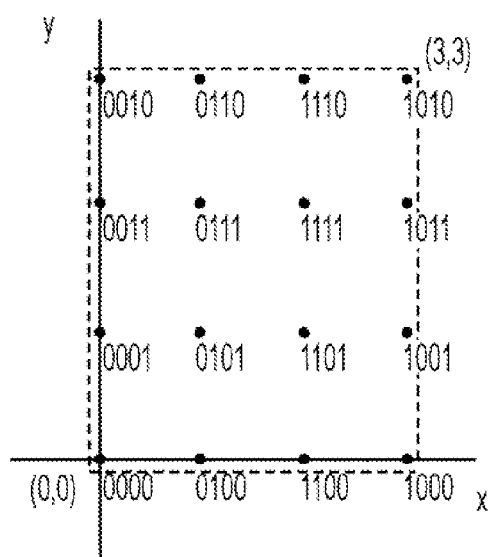
FIG. 3 illustrates labeling of points in a coset used with the constellation of FIG. 2.
Figure 4:
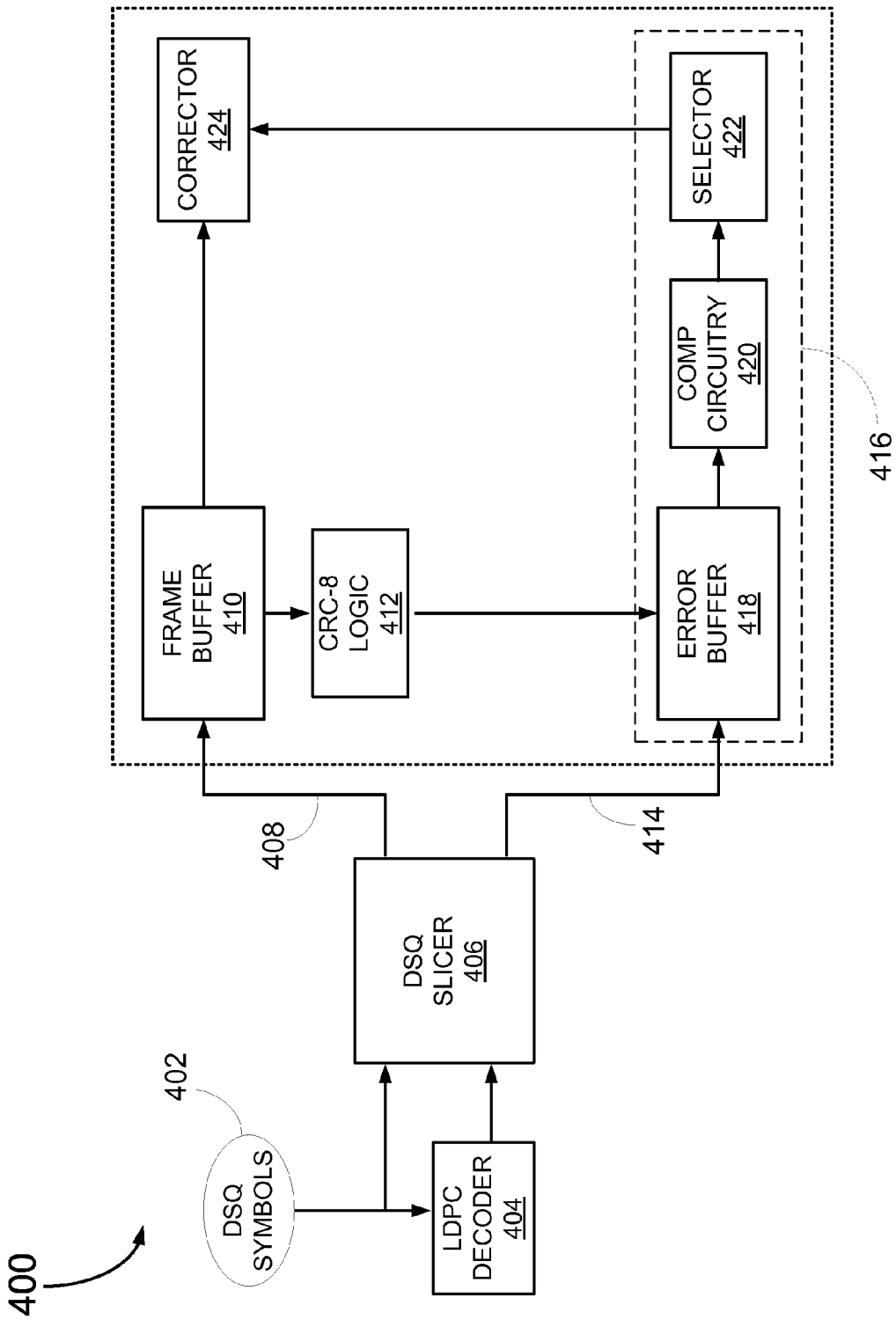
FIG. 4 is a block diagram illustrating one embodiment of a correction circuit for correcting bit errors based on an error detection code.

FIG. 4 is a block diagram illustrating one embodiment of a receiver, generally designated 400, that receives block-coded ethernet frames, such as those in accordance with 1OGBASE-T. The frames are received as 128-DSQ symbols 402 and fed to a Low-Density-Parity-Check (LDPC) decoder 404. The LDPC decoder decodes the coded bits in the 128-DSQ symbols through use of the 384 check bits associated with the 1OGBASE-T frame structure. Decoded symbols are output to an uncoded DSQ bit slicer 406 along with the original uncoded 128-DSQ information.

Further referring to FIG. 4, the uncoded bit slicer 406 generally determines which set of decoded LDPC bits (the four coded bits in the DSQ slice) corresponds to each of the uncoded set of "coset" bits. In this regard, it outputs a sliced payload along a payload path 408 to an error detection frame buffer 410 that accumulates the 512 DSQ slices that collectively make up a 128-DSQ frame. The buffer 410 cooperates with a CRC decoder 412 that calculates an error syndrome from the CRC-8 check bits and the uncoded "coset" bits associated with the frame. In the embodiments that follow, much of the discussion for error detection is in terms of a CRC-8 algorithm. Other error detection algorithms (such as CRC-16, etc.) may also be employed to achieve the many benefits described herein.

In one embodiment, the uncoded bit slicer 406 also produces an output comprising a 2-D slicer error value along an error path 414 to error logic 416. The 2-D slicer error value for each symbol comprises a set of 20 bits corresponding to x and y coordinates mapped to the 128-DSQ constellation, and the 3 uncoded coset bits. The slicer error value results from the basic slicing function in determining which coset bits correspond to the actual received data point. In other embodiments, the nearest point may be determined in a −45 degree rotated coset map.

The error logic 416 includes per-symbol circuitry comprising an error buffer 418 sufficient to store the 23-bit error values associated with each of the 512 DSQ slices, and computational circuitry 420 capable of determining the difference in the 2-D error distance value and CRC-8 error for each of the slices. In one embodiment, per-symbol calculators are employed to calculate the respective error difference values. In addition to receiving the error values, the error logic 416 includes an input to receive the calculated syndrome value from the CRC logic 412 for the corresponding payload information.

For each possible nonzero syndrome value associated with a 128-DSQ frame, a subset of between 10-14 candidate slices (out of 512) correspond to having a bit error that would have generated the syndrome. Symbol #0 has multiple answers for a syndrome because of the auxiliary CRC bit provided in the frame structure. The subset of symbols is determined through a memory, such as a lookup table or RAM, that stores candidate symbols from among the 512 possibilities that contribute to each of a possible 255 CRC-8 syndromes. The table also provides precalculated CRC-8 error values associated with each candidate. In the event of a nonzero syndrome value, the per-symbol logic 416 determines the error distance to the corresponding coset for the subset of the symbols that would correct the syndrome. A listing of the possible candidate values that correspond to the possible syndromes with associated error values is appended hereto as Appendix A.

Table 1 below illustrates one example of the mapping between four possible syndromes, and candidate DSQ slices that could have caused the nonzero syndrome if there was a bit error in the uncoded bits. In the example below, syndrome 0X01 has ten possible candidate DSQ slice numbers 20, 48, 101, 174, 202, 247, 275, 303, 356, 429, and 492. The respective error values for those slice numbers are 6, 5, 1, 2, 3, 4, 6, 5, 1, 2, and Narrowing the number of possible sources of the detected bit error from 512 to 14 (maximum) enables the relatively weak CRC-8 code to provide information to correct the bit error as more fully described below.

TABLE 1

| Candidate | Syndrome Number | | | |
|---|---|---|---|---|
| | 0X01 | 0X02 | 0X03 | 0X04 |
| 0 | 20.6 | 20.3 | 20.5 | 65.2 |
| 1 | 48.5 | 65.4 | 73.1 | 93.3 |
| 2 | 101.1 | 93.6 | 146.2 | 138.4 |
| 3 | 174.2 | 121.5 | 174.3 | 166.6 |
| 4 | 202.3 | 174.1 | 219.4 | 194.5 |
| 5 | 247.4 | 247.2 | 247.6 | 247.1 |
| 6 | 275.6 | 275.3 | 275.5 | 320.2 |
| 7 | 303.5 | 320.4 | 328.1 | 348.3 |
| 8 | 356.1 | 348.6 | 401.2 | 393.4 |
| 9 | 429.2 | 376.5 | 429.3 | 421.6 |
| 10 | 492.3 | 429.1 | 446.1 | 493.6 |
| 11 | | 473.5 | | |
| 12 | | | | |
| 13 | | | | |

With continued reference to FIG. 4, the bit representations of the error logic 416 error values from the look-up table are added to the error distance values and fed to a selector circuit 422 that employs, for example, a central comparator that evaluates the calculated distance values for the subset of candidate slices and determines which of the possible values comprises a "minimum" value. The slice having the minimum value is then selected and passed to a corrector 424. The corrector changes or "flips" one or more of the uncoded bits via an XOR circuit (not shown) to eliminate the bit error from the slice that had the bit error. The selection of the minimum distance for the symbol to correct is based on the assumption that the distance corresponds directly to the magnitude of the error impulse, and that the minimum distance is thus the most likely (as with Gaussian noise, the larger the impulsive noise event, the more unlikely it is). The error environment thus determines the selection process.

As an alternative to employing the per-symbol calculators in the computational circuitry 420 to calculate the error distances for each coset, a memory such as a look-up table may be employed to store pre-calculated error distance values. As an example, a 64-entry lookup table capable of storing on the order of 1280 bits may be used.

Figure 5:
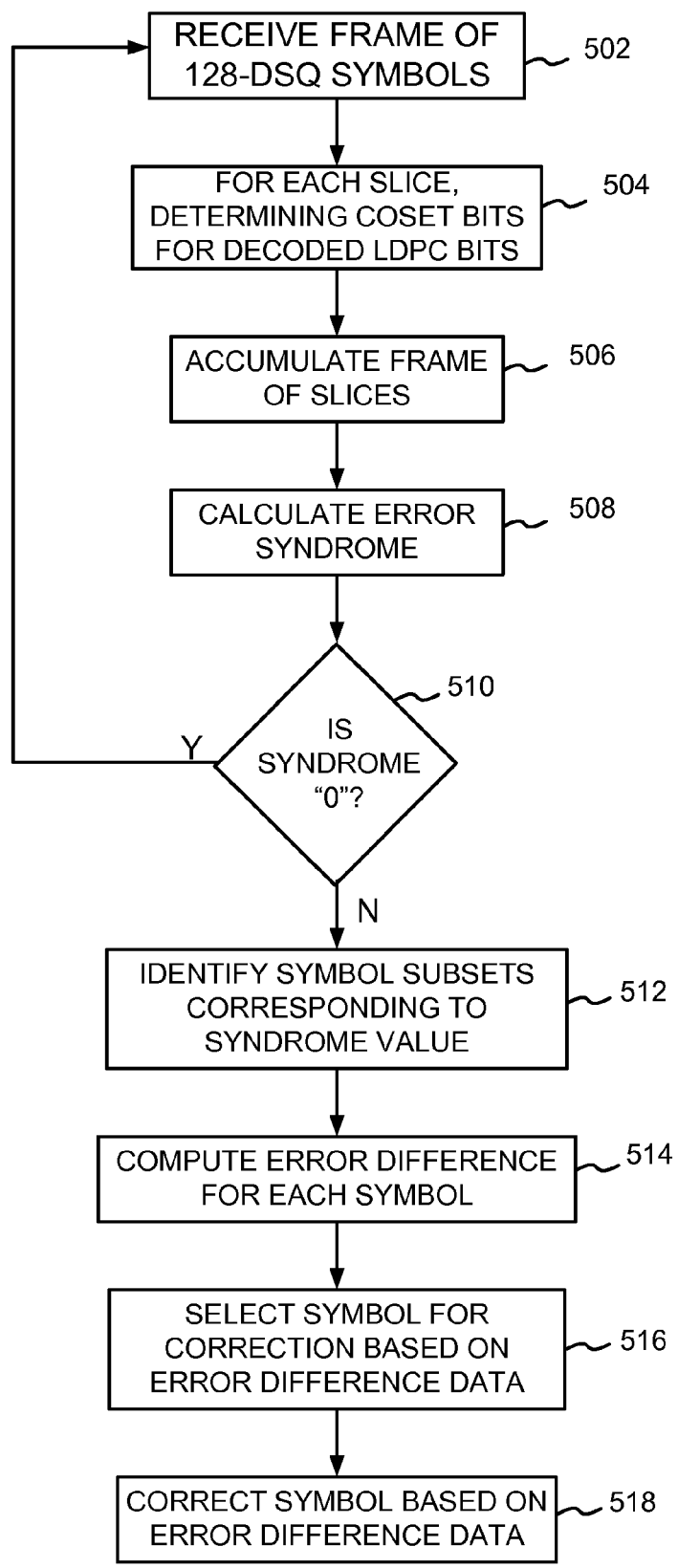
FIG. 5 is a flow diagram illustrating a method of providing error correction to block coded symbols through use of an error detection code.

FIG. 5 illustrates a flowchart reiterating the operation of the receiver circuit described above to provide error correction capability based on basic CRC error detection algorithms. The method involves receiving frames of 128-DSQ symbols, at step 502, with each frame comprising 512 sets (or slices) of bits. For each slice, the appropriate uncoded coset bits are matched to the proper set of LDPC-coded bits, at step 504. The slices are then accumulated, at step 506, and a CRC-8 error syndrome calculated over the entire accumulated frame, at step 508. A determination is then made, at step 510, as to whether the syndrome is a zero value. If the syndrome is a zero value, then the uncoded coset bits have no errors in any of the slices, and the next frame is processed, at step 502.

If a nonzero syndrome value is generated, then at step 512 the subset of slices among the 512 slices are identified that, if in error, would have generated the syndrome. The error difference (the difference between the coset error distance and the CRC-8 error) for each symbol in the identified subset of symbols is then computed at step 514. The error difference values are then evaluated, with the symbol having the lowest value selected, at step 516. The selected symbol is then corrected by XORing the error difference value with the uncoded coset bits for the selected symbol, at step 518.

Figure 6:
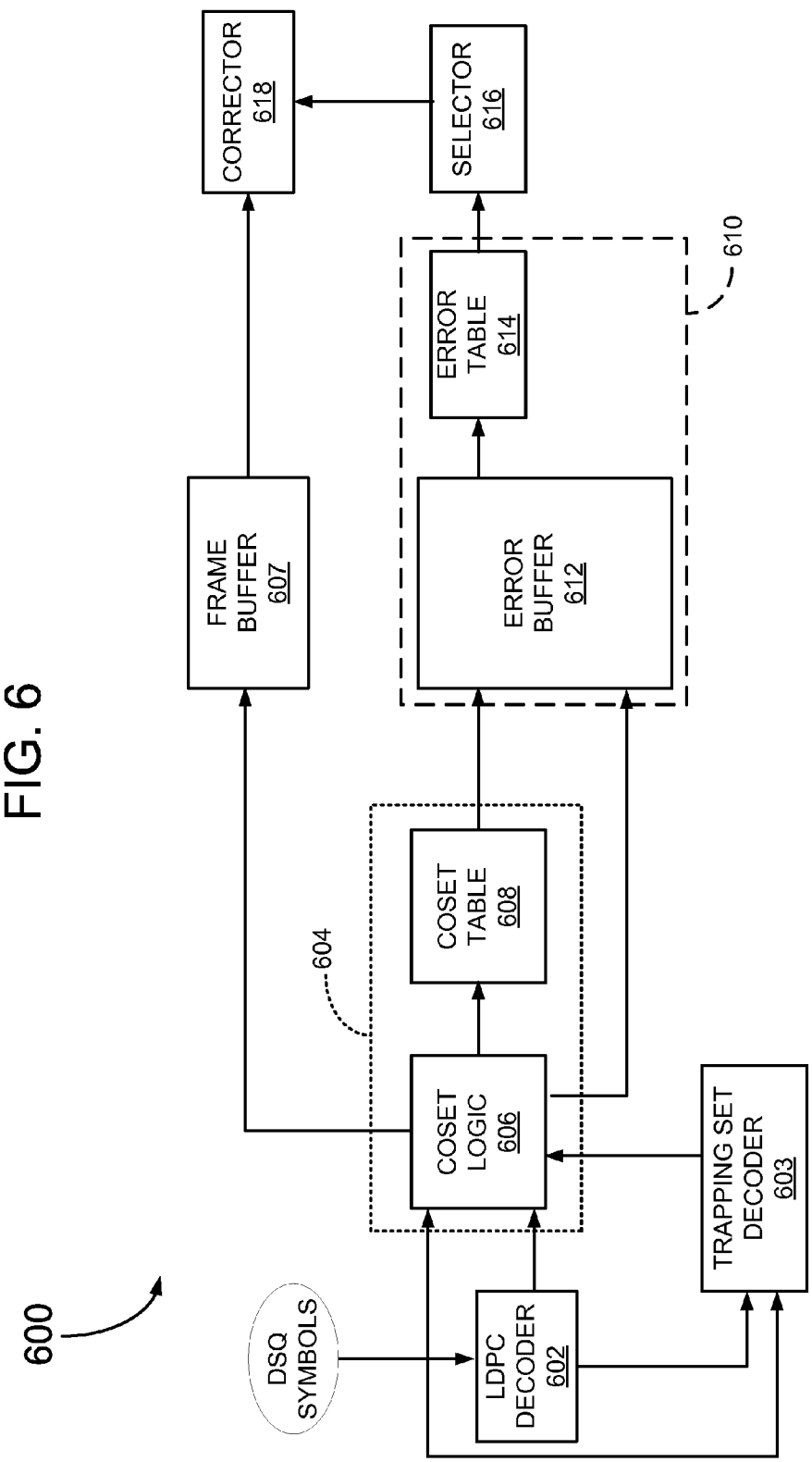
FIG. 6 is a block diagram illustrating a further embodiment of a correction circuit for correcting bit errors similar to FIG. 4.

FIG. 6 illustrates an embodiment of a receiver circuit, generally designated 600, that takes advantage of the error distance calculations for each slice in the slicer to also provide information relating to that slice's contribution to the CRC-8 error. This parallel processing enables a significant reduction in the CRC circuitry and associated processing time for each frame.

With continued reference to FIG. 6, frames of 128-DSQ symbols are received and decoded by an LDPC decoder 602, with the decoded LDPC data passed to an uncoded bit slicer 604. The slicer employs coset logic 606 and a coset table 608. The coset logic 606 includes an input to receive the uncoded LDPC data and the original PAM-16 data for each symbol. Payload information is fed from the coset logic to a frame buffer 607, where it is temporarily stored before being passed to a corrector 618. The coset logic calculates the distance information for the actual received point (in each symbol) to each of the cosets. The coset table then applies the error information in a look-up table to provide an appropriate coset selection for the LDPC bits.

The coset logic 606 also has an input to receive information from a trapping set decoder 603. In certain circumstances, the LDPC decoder may fail to converge to a proper set of bits. The trapping set decoder may be employed as a way to decode the bits should an undesirable trapping set be encountered. One example of a trapping set decoder is disclosed in copending U.S. patent application Ser. No. 12/329,514, titled "Trapping Set Decoding For Transmission Frames", filed Dec. 5, 2008, the disclosure of which is hereby incorporated by reference in its entirety, and assigned to the assignee of the disclosure herein.

Further referring to FIG. 6, the selected coset bits and the error distance information is fed from the uncoded bit slicer 604 to error logic 610. The error logic includes an error buffer 612 and an error table 614. The error buffer includes at least 512 entries to accumulate each of the 512 slices of uncoded coset bits (3 bits) and the associated LDPC bits (4 bits). The error distance information for each slice is also stored and used by the error table 614 to generate each slice's CRC-8 error contribution. A listing of the look-up table information for the individual slices is attached as Appendix B to this disclosure. A second table is then accessed that includes the syndrome information of Appendix A, which correlates syndrome values to candidate slices and the error distance values. Plural error difference values for each slice are then calculated that represent the difference between the calculated error distance value and the CRC-8 error contribution due to that slice. A selector 616 couples to the error table 614 to select the slice associated with the smallest error difference value as the "error" slice that needs correcting to the uncoded coset bits. The selector feeds its output to the corrector 618 that XORs a corrected bit value to generate a corrected slice for the frame. By utilizing the error distance information that was originally generated in the uncoded bit slicer 604, CRC error calculating circuitry in the error logic 610 may be minimized.

Figure 7:
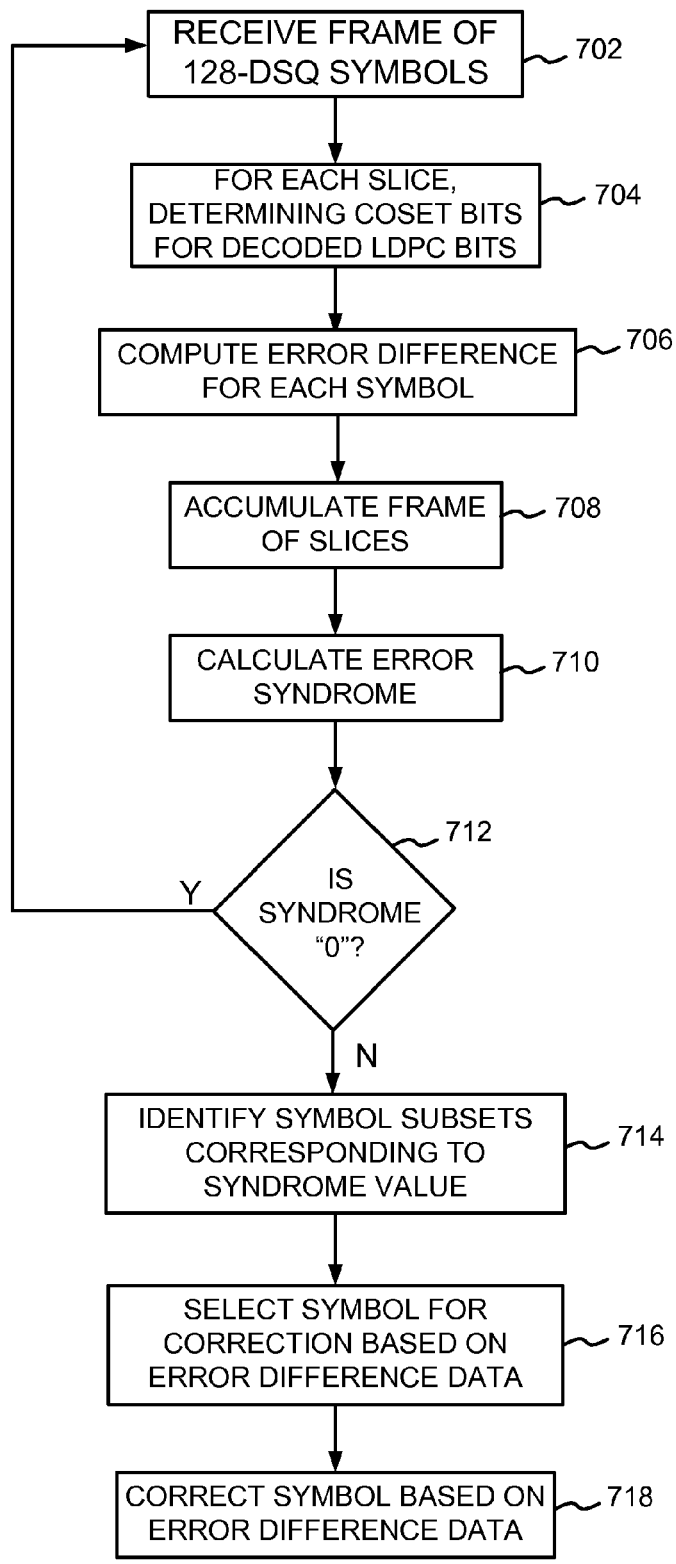
FIG. 7 is a flow diagram similar to FIG. 5 that illustrates a method of providing error correction utilizing the correction circuit of FIG. 6.

FIG. 7 illustrates a high-level flowchart similar to FIG. 5 that identifies steps corresponding to the operation of the receiver circuit 600 of FIG. 6. At step 702, the receiver circuit receives a frame of 128-DSQ symbols. Each symbol includes a set of 7 bits, where 3 of the bits are uncoded coset bits, and 4 are coded LDPC bits. For each slice, the slicer determines the appropriate coset bits for each set of LDPC bits, at step 704. As part of the coset determination, a 2-D error distance is calculated for each symbol, at step 706. This information is later reused in the event an uncoded bit is corrupted by, for example, a power spike or the like.

With continued reference to FIG. 7, the frame slices are accumulated, at step 708, and an error syndrome calculated, at step 710. If the error syndrome for the frame is determined to be "0", at step 712, then no error to the uncoded bits has been detected, and the method returns to step 702 for receipt of a subsequent frame. If a nonzero syndrome is detected at step 712, then symbol subsets are identified from a look-up table corresponding to the syndrome value, at step 714. From the subset of symbols, a symbol for correction is identified based on the error difference data, at step 716. The symbol is then corrected, at step 718, based on the error difference data.

Those skilled in the art will appreciate the benefits and advantages afforded by the error correction circuitry described above. By employing minimal logic and memory resources, straightforward error detection circuitry (such as CRC-8, CRC-16, etc.) may contribute to actually correcting errors to uncoded coset bits. Correcting bit errors rather than detecting the bit error(s) and retransmitting entire frames provides significant performance benefits.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. A method comprising:
   receiving a frame of block-coded symbols, each symbol including a set of bits encoded via an error correction code and a set of unencoded bits, the unencoded bits not coded via the error correction code;
   calculating an error syndrome after receiving the frame;
   storing the symbols to associate each set of encoded bits with a set of coset bits;
   detecting a bit error in one of the plurality of symbols, the bit error associated with the at least one unencoded bit, the detecting carried out in accordance with an error detection algorithm;
   calculating a minimum error distance value for each of the candidate slices;
   subtracting each minimum error distance value from a CRC error value associated with each slice to generate an error difference value;
   identifying the symbol having the bit error from among the plurality of symbols by selecting the symbol having the lowest error difference value; and
   correcting the bit error in the identified symbol without discarding the frame, the correcting based on a selection from stored predetermined candidate solutions.

2. The method according to claim 1 wherein:
   the error detection algorithm is based on a plurality of check codes.

3. The method according to claim 2 wherein the plurality of check codes are in accordance with a CRC-8 code.

4. The method according to claim 1 wherein the correcting comprises changing one or more of the unencoded bit values in the selected symbol to eliminate the non-zero syndrome.

5. The method according to claim 1 wherein the slicing includes calculating a 2-D error distance value for each of the candidate slices.

6. The method according to claim 1 wherein each of the symbols includes three unencoded bits.

7. A method comprising:
   receiving a plurality of block-coded symbols that define a frame of data, each symbol including a set of encoded bits and a set of unencoded bits;
   storing the symbols to associate each set of encoded bits with a set of coset bits;
   calculating an error syndrome after receiving the frame of data;
   detecting a bit error in one of the plurality of symbols from the calculated error syndrome, the bit error associated with the at least one unencoded bit, the error syndrome calculated in accordance with an error detection algorithm;
   identifying the symbol having the bit error from among the plurality of symbols based on the error detection algorithm, the identifying including
      selecting a set of predetermined candidate slices from the plurality of symbols that correspond to the calculated error syndrome,
      calculating a 2-D error distance value for each of the candidate slices,
      subtracting each 2-D error distance value from a CRC error value associated with each slice to generate an error difference value, and
      wherein identifying comprises selecting the symbol having the lowest error difference value; and
   correcting the bit error in the identified symbol.

8. The method according to claim 7 wherein:
   the error detection algorithm is based on a plurality of check codes.

9. The method according to claim 8 wherein the plurality of check codes are in accordance with a CRC-8 code.

10. The method according to claim 7 wherein the correcting comprises changing one or more of the unencoded bit values in the selected symbol to eliminate the non-zero syndrome.

* * * * *